United States Patent [19]

Smith et al.

[11] 4,195,339
[45] Mar. 25, 1980

[54] SEQUENTIAL CONTROL SYSTEM

[75] Inventors: Walter A. Smith; Raymond T. Harp, both of Wichita, Kans.

[73] Assignee: NCR Corporation, Dayton, Ohio

[21] Appl. No.: 821,942

[22] Filed: Aug. 4, 1977

[51] Int. Cl.² .............................................. G11C 8/00
[52] U.S. Cl. .................................................. 364/200
[58] Field of Search ... 364/200 MS File, 900 MS File

[56] References Cited

U.S. PATENT DOCUMENTS

| 3,402,396 | 9/1968 | McBride | 364/900 |
|---|---|---|---|
| 3,593,306 | 7/1971 | Toy | 364/200 |
| 3,673,573 | 6/1972 | Smith | 364/200 |
| 3,774,166 | 11/1973 | Vigliante | 364/200 |
| 3,900,835 | 8/1975 | Bell et al. | 445/1 |
| 3,961,313 | 6/1976 | Bodner et al. | 364/200 |
| 3,972,026 | 7/1976 | Waidman et al. | 364/900 |
| 3,990,052 | 11/1976 | Gruner | 364/200 |
| 4,053,944 | 10/1977 | Dixon | 364/200 |
| 4,054,945 | 10/1977 | Ichiko et al. | 364/200 |
| 4,063,310 | 12/1977 | McDonald | 364/900 |

Primary Examiner—Gareth D. Shaw
Assistant Examiner—C. T. Bartz
Attorney, Agent, or Firm—J. T. Cavender; Albert L. Sessler, Jr.

[57] ABSTRACT

A digital circuit is disclosed which may be used to sequence a series of events and which can alter the sequence of events as a function of the inputs to the circuit. A read-only memory is accessed by an address register which can increment the address of the instruction which it is desired to access from memory either incrementally, as by counting, or in a branching mode by altering the address by an amount corresponding to a portion of one or more of the instructions taken from the memory. Branching may be conditional or unconditional.

6 Claims, 9 Drawing Figures

SEQUENTIAL CONTROL SYSTEM

BACKGROUND OF THE INVENTION

Most data processing systems include a plurality of peripheral devices which must be controlled to perform certain operations at certain times or in certain sequences. Control of these peripheral devices in accordance with the requirements of the data processing system can be accomplished in various ways. Frequently, microprocessors have been used for this purpose in the past. One disadvantage to the use of microprocessors for this purpose in small systems is that they provide a relatively expensive control means, and another disadvantage is that they are often relatively slow, due to the large number of cycles of operation which a typical microprocessor requires for performing a series of sequential operations.

A need therefore exists for a data processing device capable of controlling peripheral equipment or processes not requiring either arithmetic or the power of a microprocessor, but having control requirements which are sequential in nature and which are sufficiently complex in character to require an extensive array of small and medium scale integrated circuits.

SUMMARY OF THE INVENTION

This invention relates to data processing systems and more particularly relates to apparatus for controlling the sequence of a series of events in association with such systems.

In accordance with one embodiment of the invention, a control system for causing a series of events to occur in sequence and capable of altering said sequence comprises storage means for storing a plurality of coded instruction signals at a corresponding plurality of addresses, each signal comprising at least a first and a second portion; address register means coupled to the storage means for providing an address to select a coded instruction signal, said address register means being capable of incrementing the address provided in successive operations of the system by a predetermined increment and also capable of modifying the address in a non-incrementing mode; coupling means for presenting said second portion of a coded instruction signal to the address register means; and branch control means controlled by the first portion of the coded instruction signal and coupled to the address register means for controlling whether or not said second portion of a coded instruction signal is loaded into the address register means during a given operation to modify the address in a non-incrementing mode.

It is accordingly an object of the present invention to provide a novel and efficient control system for causing a series of events to occur in sequence and capable of altering said sequence.

Another object is to provide a control system in which the instruction words utilized in exercising sequential control of various devices are stored in a storage means, in which the storage addresses are generated by an address register means, and in which branching operations may be performed by loading portions of the instruction words into the address register means to modify the addresses generated thereby.

A further object is to provide a control system in which instructions for exercising sequential control are stored in a read-only memory, and in which novel means are provided for addressing said read-only memory means either incrementally or for branching.

With these and other objects, which will become apparent from the following description, in view, the invention includes certain novel features of construction and combinations of parts, one form or embodiment of which is hereinafter described with reference to the drawings which accompany and form a part of this specification.

BRIEF DESCRIPTION OF THE DRAWINGS

FIGS. 2A, 2B, 2C, 2D and 3 are schematic diagrams showing the details of the circuitry of the present invention.

FIG. 4 is a view showing the manner in which FIGS. 2A, 2B, 2C and 2D are assembled to form a schematic diagram.

DETAILED DESCRIPTION OF THE PREFERRED EMBODIMENT

Figure 1:
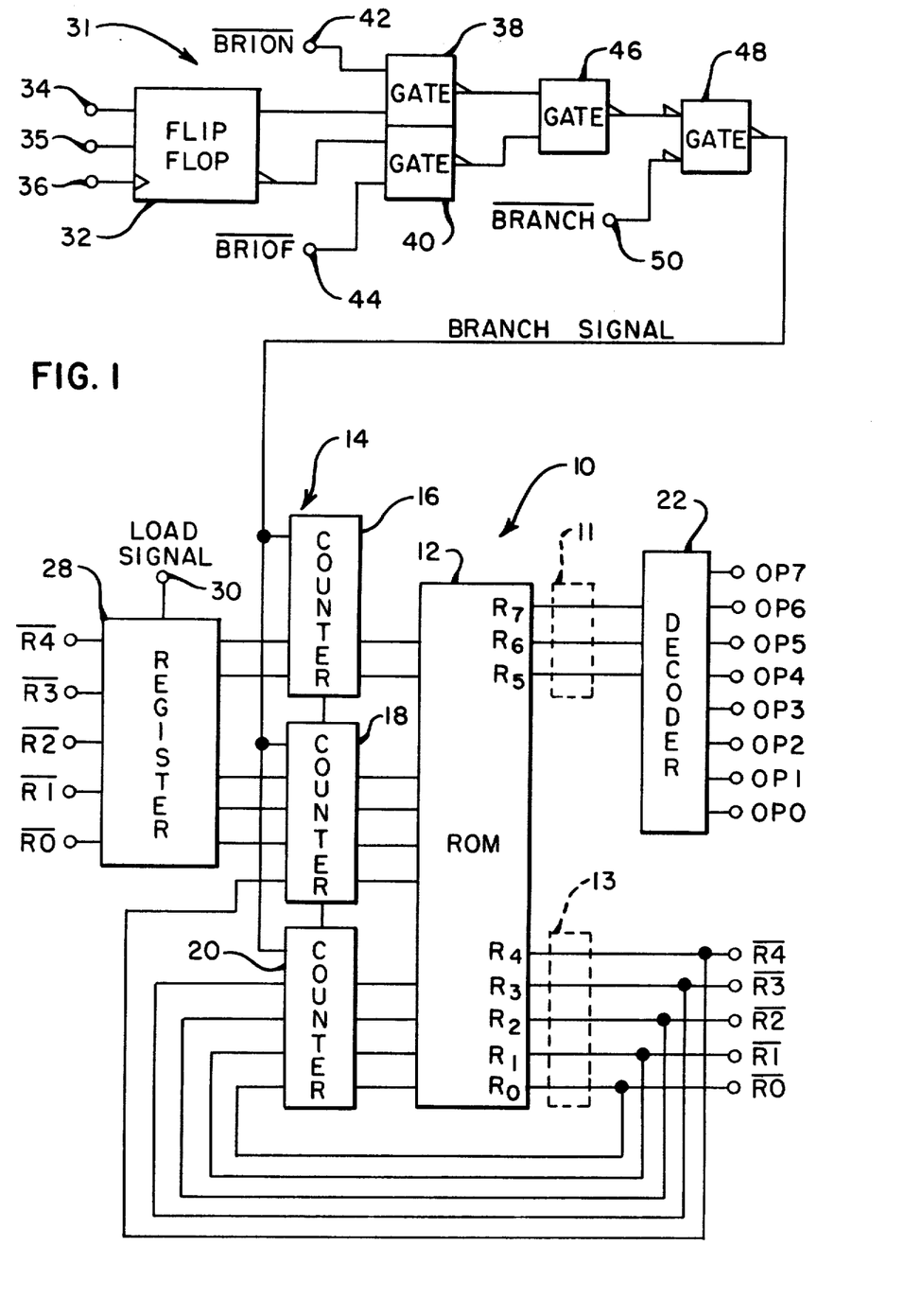
FIG. 1 is a block diagram of the control circuit of the present invention.

Referring to FIG. 1, there is shown a block diagram of a control circuit 10 constructed in accordance with the present invention. Certain of the circuit elements which are included in the detailed circuit diagram of FIGS. 2A to 2D inclusive are omitted from the block diagram of FIG. 1 in the interest of simplicity. Included in the circuit is a read-only memory 12 which stores instructions at predetermined addresses for reading out on demand in accordance with address selection by an address register 14 which consists, in the illustrated embodiment, of three 4 bit counters 16, 18 and 20. It should be noted that while the memory 12 is shown as a read-only memory, and the address register 14 is shown in the form of three 4 bit counters, other suitable implementations of these devices could be made, if desired. For example, the memory 12 could be of the read-write type, and the address register could be a single 12-bit counter. Similarly, the other elements forming a part of the circuit of the present invention could take other forms than those specifically disclosed herein without departing from the spirit of the invention.

In the illustrated embodiment, a 10-bit address is generated by the address register 14 to access the memory 12 at any one of 1,024 locations. This address may be generated by incremental counting of the three 4-bit counters, or it may be generated, when a branching operation is required, by loading one or more portions of the instruction output signal from the memory 12 into the address register 14, as will subsequently be described.

In the illustrated embodiment, the instruction signals stored in the memory 12 are 8 bits, or 1 byte, in length, and are separated by the circuitry into a 3-bit operation code and a 5-bit function code. The individual bits of the 3-bit operation code are inverted, in the illustrated embodiment, by inverters represented generally in FIG. 1 by the block 11 and decoded by a one-of-eight decoder 22 to provide one of eight different command codes, each of which will normally be a "set" signal, a "sample" signal, a "load" signal, or a "branch" signal.

A "set" signal is normally utilized to cause the operation of a component of the operating circuitry, such as setting a latch or resetting a counter, for example. A "sample" signal is used to determine the condition of a particular line or component in the circuit. A "load" signal is used to cause information available to a particular component, such as a register, to be entered therein. A "branch" signal is used to cause the address register to select a different address in the memory than would be selected if the address register continued its normal incremental counting.

One appropriate group of command codes is shown in tabular form below, with the three operation code bits being designated $R_5$, $R_6$ and $R_7$:

| Ident. | Description | Command Codes Code | $R_7$ | $R_6$ | $R_5$ |
|---|---|---|---|---|---|
| Op 0 | Set 1 | $\overline{SET\ 1}$ | 1 | 1 | 1 |
| Op 1 | Set 2 | $\overline{SET\ 2}$ | 1 | 1 | 0 |
| Op 2 | Sample | $\overline{SAMPLE}$ | 1 | 0 | 1 |
| Op 3 | Load 2 delay | $\overline{LOAD\ 2}$ | 1 | 0 | 0 |
| Op 4 | Unconditional branch | $\overline{BRANCH}$ | 0 | 1 | 1 |
| Op 5 | Branch if indicator on | $\overline{BRION}$ | 0 | 1 | 0 |
| Op 6 | Branch if indicator off | $\overline{BRIOF}$ | 0 | 0 | 1 |
| Op 7 | Load 1 | +LSMB | 0 | 0 | 0 |

It should be recognized that the above table of command codes is only illustrative, for the present embodiment, and that a large number of different combinations of commands could be utilized in accordance with the particular application to which the controller is put. Normally, however, the set of command codes will include at least one in each of the "set", "sample", "load" and "branch" categories.

The five-bit function code, comprising bits $R_0$, $R_1$, $R_2$, $R_3$ and $R_4$, portion of the instruction signal is used for a number of purposes. In the illustrated embodiment, these bits are inverted by inverters represented generally in FIG. 1 by the block 13 and thereafter are considered as function code signals $\overline{R0}$ to $\overline{R4}$, respectively. The five bits may be decoded to identify a particular device or component which is to be controlled by the circuit of the present invention, said device being triggered or operated by a suitable means, such as a "Set" command, when identified by the function code. In addition, the function code can be applied to identify a particular device or line, the output condition of which is to be determined. A multiplexer, such as the multiplexers 24 and 26 of FIG. 3, may be used to identify a selected device or line by generation of a signal corresponding to the condition of said device or line, in connection with such an operation if desired, in the same general manner as will be subsequently described in connection with the multiplexers 24 and 26, although other suitable means may also be employed. Also, the digital value of the function code may be used in "load" and "branch" operations, to be entered into selected registers or counters under appropriate commands.

Examination of FIG. 1 will show that selected ones of the inverted outputs from the memory 12 on which the function code signals $\overline{R0}$, $\overline{R1}$, $\overline{R2}$, $\overline{R3}$, $\overline{R4}$ appear are applied to the counters 18 and 20 of the address register 14 (signals $\overline{R0}$ to $\overline{R3}$ being applied to the counter 20 and signal $\overline{R4}$ being applied to the counter 18) and to a five-bit parallel in/parallel out latch or register 28. Selected outputs from this register are in turn connected to inputs of the counters 16 and 18 of the address register 14.

Entry of the function code signals into the register 28 is controlled by the presence or absence of a "load" signal at an input 30. Entry of the contents of the register 28 into the counters 16 and 18 during a subsequent cycle of operation of the controller is controlled by the presence or absence of a "branch" signal, as will subsequently be described.

In order for a controller such as the control circuit 10 to provide an operating sequence of the necessary length and versatility to control peripheral devices of the complexity commonly found in typical data processing systems, it must have the capability of branching to any one of a large number of addresses in the memory, some of said addresses being quite distant from the address from which the branch command originated. The present invention provides the capability for branching to any one of the 1,024 locations of the read-only memory.

It will be seen that modifications of the address register 14 by application of data thereto from the five function code signals $\overline{R0}$-$\overline{R4}$ can alter the address only by a factor of up to 32, since only 5 bits are involved, which is not sufficient for the branching requirements for many uses of the controller. The alteration of 5 additional bits of the address register by entry of data thereto from the register 28 directly into counters 16 and 18 is thus provided, under control of a branch signal which will normally be the same branch signal causing entry of the information from the five function code signals $\overline{R0}$-$\overline{R4}$ into the counters 18 and 20. This combination of a total of 10 bits by which the address may be altered gives a total of $2^{10}$ or 1,024 locations to which a branch may be made.

In the illustrated embodiment, three different types of branches may occur, the type of branch being determined by the command codes set forth above. Two of these branch commands are conditional branches, dependent upon the state of a component designated for convenience as an "indicator", while the third branch is unconditional and will always result in a branch. As shown in FIG. 1, the circuit of the present invention includes branch control means 13 in which an indicator 32 may take the form of a flip flop which is set to one of two different states, depending upon the condition of a selected external signal from some other part of the circuit such as, for example, a given lach in a give peripheral device, applied to an input 34 of the indicator 34. The various inputs capable of controlling the indicator 32 may, if desired, be taken through one or more multiplexers, with the selection of a given input being made in accordance with the function code taken from a given instruction of the read-only memory 12. An input 35 of the indicator 32 is connected to a master reset line on which a reset pulse $\overline{MR}$ may be applied to reset the controller 10, and a clock input 36 of the indicator 32 is connected to a line on which a "sample" command is applied.

First and second outputs from the indicator 32 are connected, respectively, to inputs of gates 38 and 40, which may be exclusive OR gates. The other inputs 42, 44 of these gates are connected to lines on which the $\overline{BRION}$ (Branch If Indicator On) and $\overline{BRIOF}$ (Branch If Indicator Off) commands are applied. The outputs of gates 38 and 40 are connected to the inputs of a NAND gate 46, the output of which is connected to one input of an AND gate 48, having a second input 50 to which is connected a line on which the $\overline{\text{BRANCH}}$ (unconditional branch) command is applied.

It will be seen that a branch signal will appear on the output of the gate 48 if any one of three conditions exists: first, an unconditional branch signal is applied to the input 50 of the gate 48; second, a "Branch If Indicator On" signal is applied to input 42 and the indicator 32 is set to an "On" condition; third, a "Branch If Indicator Off" signal is applied to the input 44 and the indicaor 32 is set to an "Off" condition.

The output of the gate 48 is connected to each of the three counters 16, 18 and 20, so that if a branch command is generated by the branch control means 31, it will be applied to the address register 14, and will cause the five digits presented to said address register by the register 28 and the five digits presented to said address register 14 directly from the memory 12, to be entered into said address register and used as the next address for accessing the memory 12.

The above constitutes a general description of the organization of the circuit of the present invention in accordance with the showing of FIG. 1. For a more detailed description of the circuit elements and interconnections, as well as the timing and waveforms associated therewith, reference may be had to the following explanation, together with the showings of FIGS. 2A, 2B, 2C, 2D, 3, 5A and 5B.

Figure 2A:
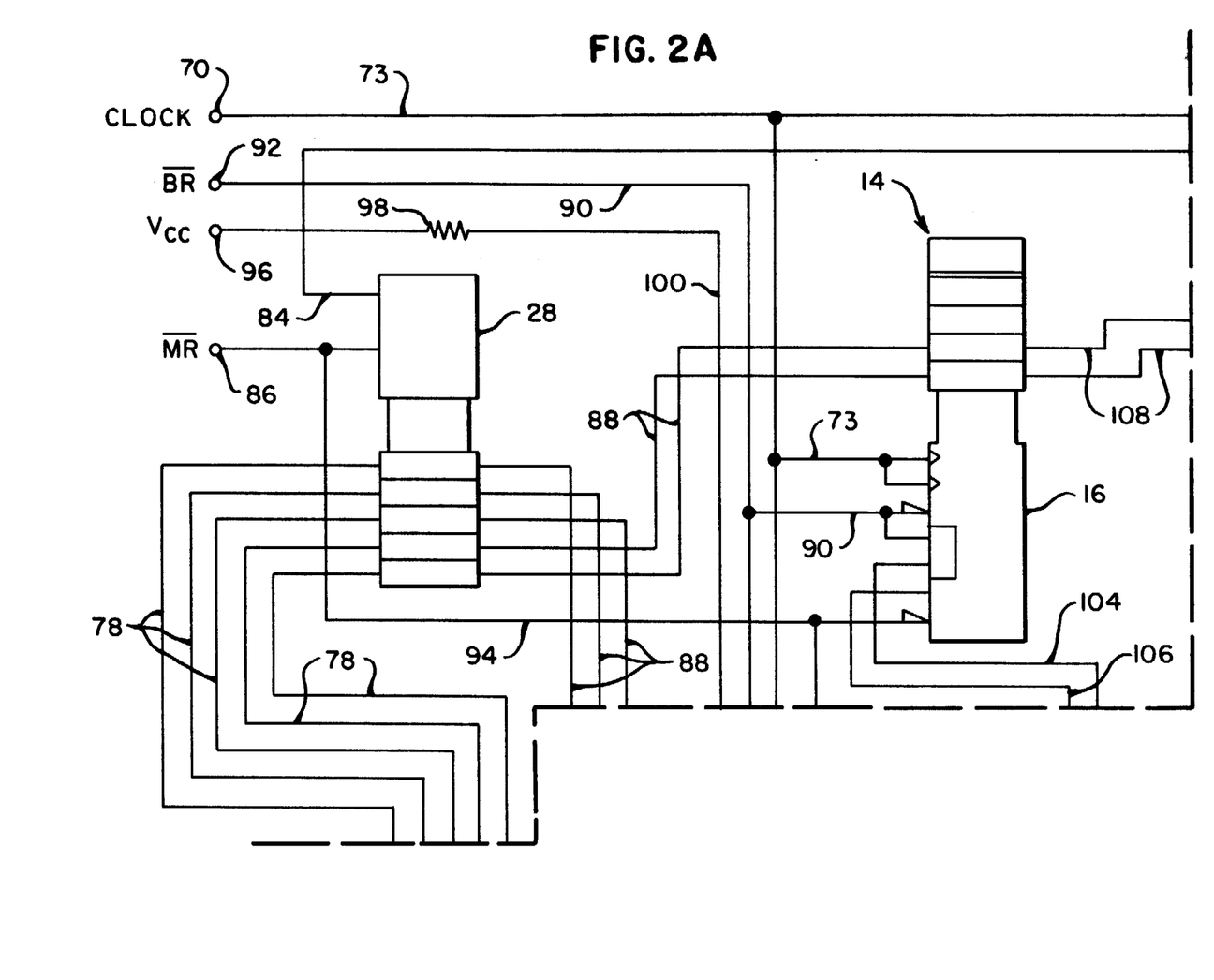
Figure 2B:
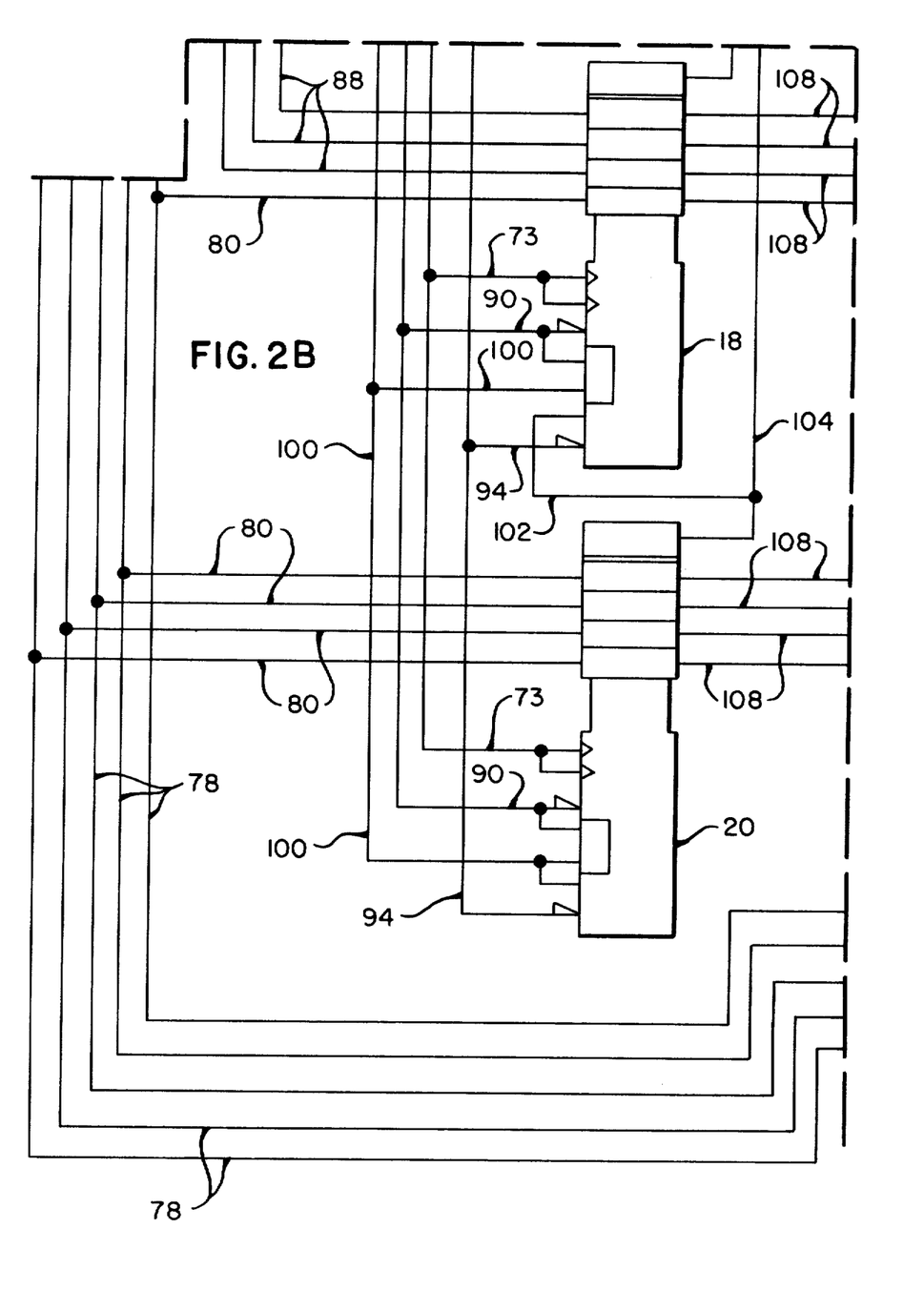
Figure 2C:
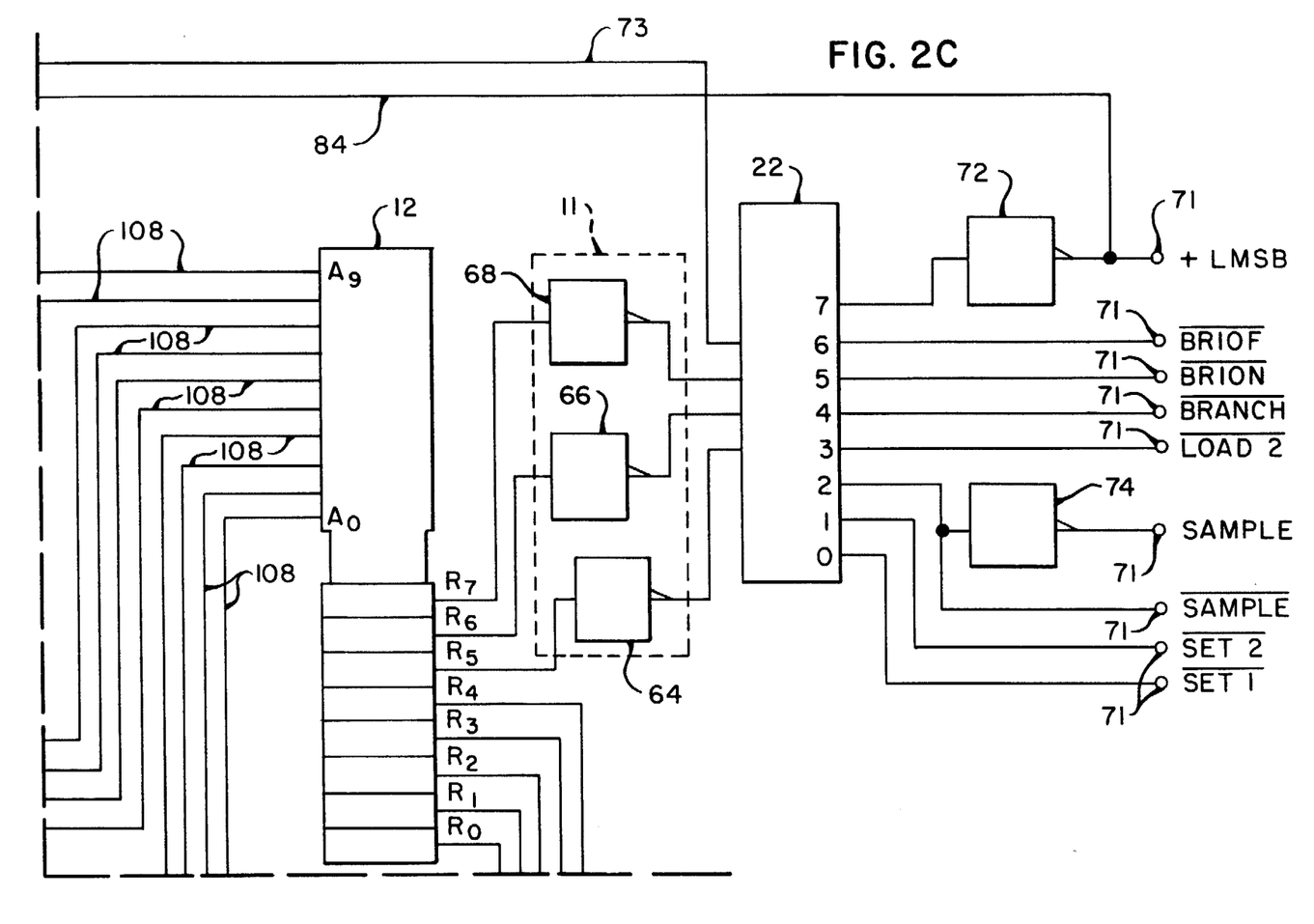
Figure 2D:
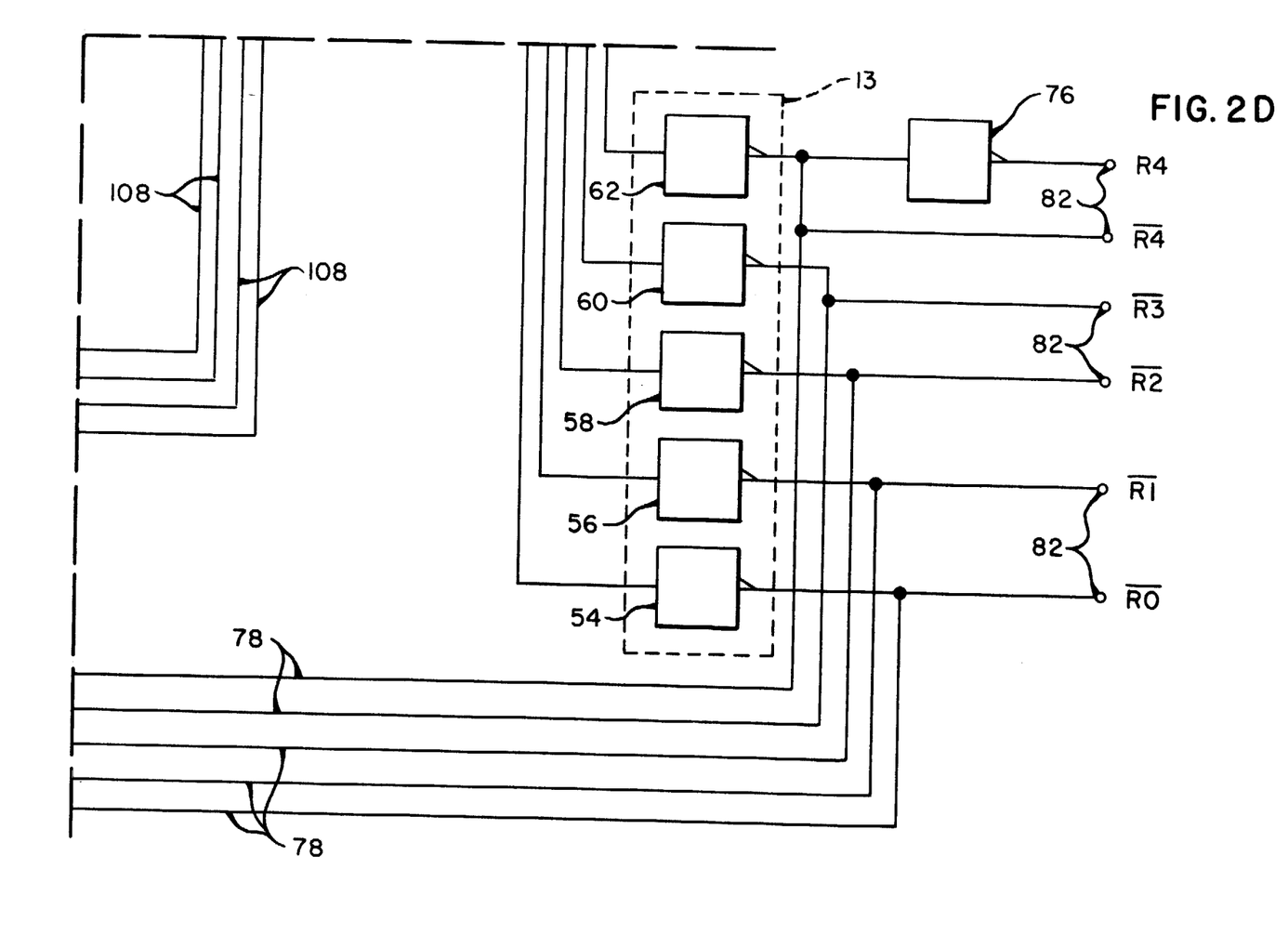
Figures 3, 4:
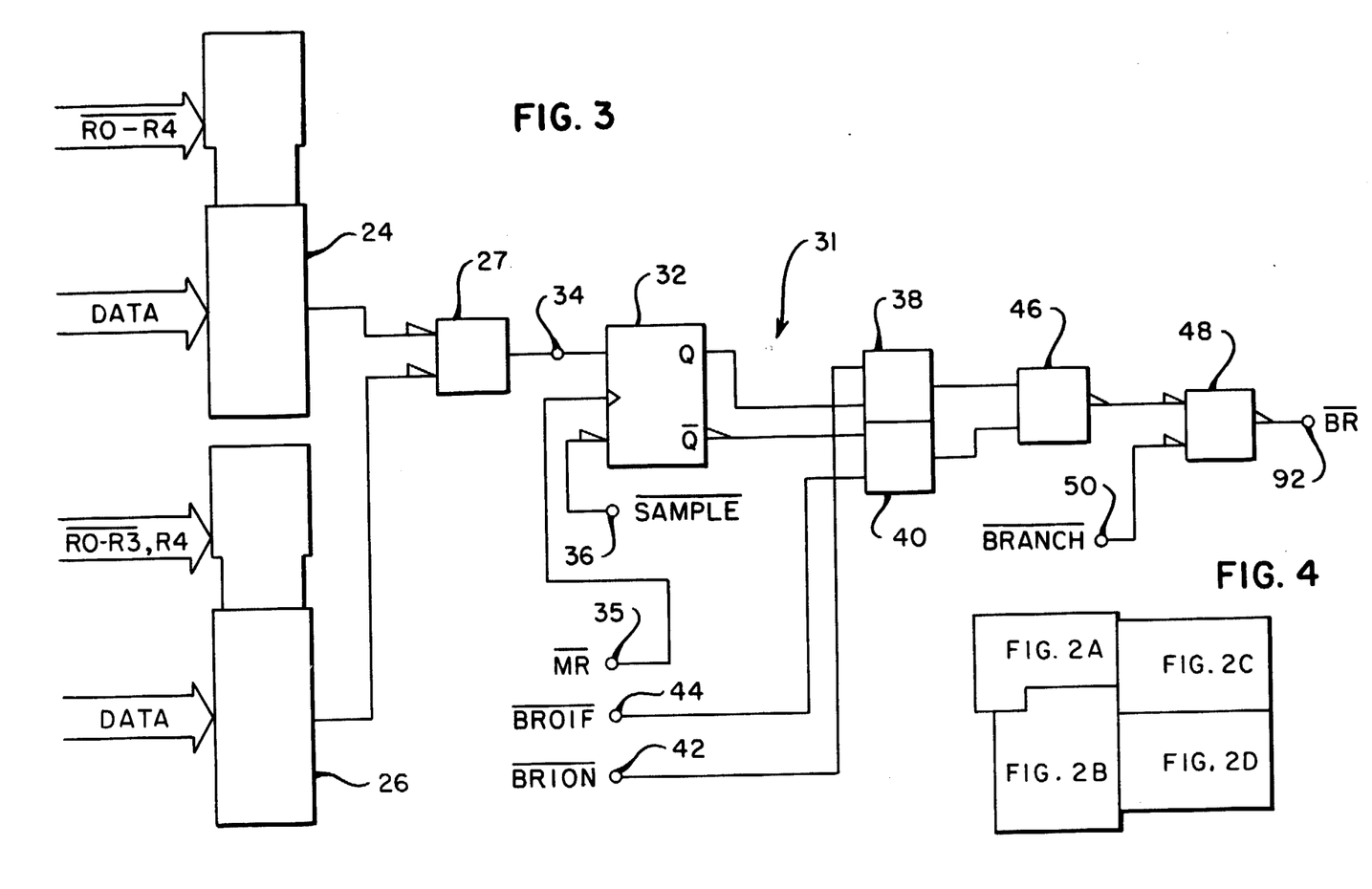

Reference may first be had to FIG. 4, which shows a diagram of how the FIGS. 2A, 2B, 2C and 2D should be placed together. FIG. 3 also constitutes a part of the detailed diagram of the circuitry, and its relationship to the circuit of FIGS. 2A to 2D inclusive may be ascertained by the connection of like terminals in the respective figures. Those elements or components of FIGS. 2A to 2D inclusive and FIG. 3 which also appear in FIG. 1 have been given the same reference characters as in FIG. 1.

Referring now to FIGS. 2A to 2D inclusive, the read-only memory or ROM 12 in the illustrated embodiment is an 8-bit device which, in the illustrated embodiment, is of type 6276, manufactured by Monolithic Memories, Inc. The eight outputs from the ROM 12 are designated $R_0$ to $R_7$ inclusive and are connected to inverters 54, 56, 58, 60, 62, 64, 66 and 68, respectively. These inverters perform a signal inverting function, slightly delay the signal, and also increase the driving capability of the signal to enable it to drive more than one load or gate, if necessary. The inverters may be of type 9016, manufactured by Fairchild Camera and Instrument Corporation. It should be noted that with a different logical implementation of the controller, using a different type of ROM or other storage device, the inverters might not be necessary.

The inverted signals $\overline{R5}$, $\overline{R6}$ and $\overline{R7}$ are applied to the inputs of the decoder 22, which may be of type 9301, manufactured by the Fairchild Camera and Instrument Corporation, together with a system clock signal, applied at terminal 70 (FIG. 2A), and carried over conductor 73. During each operating cycle, the signals $\overline{R5}$, $\overline{R6}$ and $\overline{R7}$ are decoded by the decoder 22 in accordance with the table of Command Codes previously given in this description. An output signal of appropriate level appears on the selected output of the decoder 22, said outputs being diagrammatically represented by the terminals 71 in FIG. 2C. It will be noted that the +LMSB signal is taken from the output of an inverter 72, and that the $\overline{\text{SAMPLE}}$ signal from the decoder 22 is inverted by an inverter 74 to provide a SAMPLE signal in addition. Both the inverters 72 and 74 may be of type 9016.

The inverted signals $\overline{R0}$ to $\overline{R4}$ inclusive, together with a re-inverted signal R4 which has passed through an additional inverter 76 of type 9016, are utilized in a number of different circuit paths. The signals $\overline{R0}$ to $\overline{R4}$ are carried over conductors designated generally as 78 to the 5-bit register 28, and over further conductors designated generally as 80 to the counters 18 and 20. In addition, these signals, and the signal R4, are applied to the multiplexers 24, 26 of FIG. 3 for line selection purposes, and may be applied to various other devices outside the controller circuit for selection and control purposes, these connections being diagrammatically represented by the terminals 82 in FIG. 2D. Selection of one of the two multiplexers 24 and 26 is controlled by which of the signals R4 or $\overline{R4}$ is at a predetermined logic level.

The 5-bit register 28 may be a device of type 74174, manufactured by Texas Instruments, Inc. Entry of the signals $\overline{R0}$ to $\overline{R4}$ presented thereto over the conductors 78 is controlled by a load signal +LMSB, applied to the register 28 from the output of the inverter 72 (FIG. 2C) over a conductor 84. The register 28 may be reset to a "zero" condition by application of a "master reset" signal $\overline{\text{MR}}$ thereto, over the terminal 86, at the beginning of operation of the controller circuit, or at other appropriate times.

Application of a +LMSB signal to the register 28 causes the information represented by the signals $\overline{R0}$ to $\overline{R4}$ to be loaded into and stored in the register 28. This information remains stored therein until the register is reset by a master reset signal $\overline{\text{MR}}$ applied thereto, or until new data is entered by another "load" operation, which automatically erases the information previously stored.

The five digits of information thus stored are applied over conductors 88 to the inputs of the counters 16 and 18, but are not entered into said counters in the absence of a branch signal $\overline{\text{BR}}$ appearing on the conductor 90 which is connected to the branch control means 31 (FIG. 3), as represented diagrammatically by the terminal 92 appearing in FIGS. 2A and 3.

Since the branch control means 31 has previously been described in connection with the showing of FIG. 1, that description will not be repeated. It may be noted that the external signal applied to input 34 of the indicator 32 can, if desired, be taken from one of the plurality of multiplexers such as the multiplexers 24, 26 shown in FIG. 3, which may be of type 74150 manufactured by Fairchild Camera and Instrument Corporation. A plurality of data lines from such components as latches, switches, indicators, etc., represented in FIG. 3 by the broad "DATA" arrows associated with each multiplexer, can be connected to the multiplexer inputs, and a given one of these lines in each multiplexer can be selected by a predetermined combination of function code signals $\overline{R0}$ to $\overline{R3}$ represented in FIG. 3 by a second broad arrow associated with each multiplexer. Selection of a given multiplexer may be controlled by the signal levels of the function code signals R4 and $\overline{R4}$, as previously described.

Each multiplexer is provided with a single output, each of which is connected to one input of a NAND gate 27, which may be of type 7400, manufactured by Texas Instruments, Inc. The output from said NAND gate is connected through the terminal 34 to one input of the indicator 32 as previously described. It will thus be seen that the particular signal selected for application to the indicator 32 is determined by the function code taken from the selected instructions stored in the ROM 12.

In further reference to the branch control means 31 of FIG. 3, the indicator 32 may be a "D" flip flop of type 7474 manufactured by Texas Instruments, Inc.; the exclusive OR gates 38, 40 may be of type 7486 manufactured by Texas Instruments, Inc.; the NAND gate 46 may be of type 7400 manufactured by Texas Instruments, Inc.; and the AND gate 48 may be of type 7408 manufactured by Texas Instruments, Inc.

The branch signal $\overline{BR}$ provided by the branch control means 31 is applied over the terminal 92 and the conductors 90 to each of the counters 16, 18 and 20, making up the address register 14. These counters may be of type 9316 manufactured by Fairchild Camera and Instrument Corporation. Also applied to each of the counters when generated is the master reset signal $\overline{MR}$ which appears on the terminal 86 and is carried over conductors 94. In addition, the system clock is applied to the counters over the conductor 73, and a DC power supply $V_{CC}$ appears on terminal 96 and is applied through a 390-ohm pull-up resistor 98 and a conductor 100 to the counter 20, and thence to the counters 18 and 16 over conductors 102 and 104. This power supply pulls counter inputs, which would otherwise "float", to a level which minimizes susceptibility to noise. An additional conductor 106 connects the same respective terminals on counters 18 and 16 as the conductor 102 on counters 20 and 18.

Ten of the outputs of the counters 16, 18, and 20 are connected over conductors 108 to the address inputs of the ROM 12, in order to provide the ten digits of the addresses for the instructions stored in the ROM. It will be seen that four of the conductors 108 connect the four stages of each of the counters 20 and 18 to the ROM 12, and two stages of the counter 16 are so connected. It will be obvious that if more address digits were required for a higher capacity ROM, the remaining two stages of the counter 16 could be employed, and if need be, a higher capacity address register could be used.

A description of the operation of the circuits of FIGS. 2A to 2D inclusive and FIG. 3 will now be made with reference to the waveforms of FIGS. 5A and 5B. It may first be helpful to note that the control circuit 10 is operated by a clock which is essentially a square wave in configuration, as shown by the uppermost waveform in FIGS. 5A and 5B, and has a frequency of 2.3 MHz in the illustrated embodiment, with the upper and lower logic levels of each complete pulse being of equal duration of 217 nanoseconds each. During the first half of each complete clock pulse, the circuit is in an "access" mode, during which time an address is entered into the read-only memory 12. During the second half of each complete clock pulse, the circuit is in an "execute" mode, during which time, the 8 output bits of the instruction at the selected address in the ROM are decoded, and the decoded command, be it a "set", a "sample", a "load" or a "branch" is being executed. As may be seen from the waveforms of FIGS. 5A and 5B, and as will be subsequently explained, certain relatively complex operations, such as a ten digit branch, may require a plurality of operating cycles of the circuitry for completion, with each cycle being initiated by a single clock pulse. For example, a conditional branch operation will normally require three cycles of operation, one to set the indicator 32, one to load the register 28 and one to perform the actual branch. However, these cycles need not be consecutive.

Figure 5A:
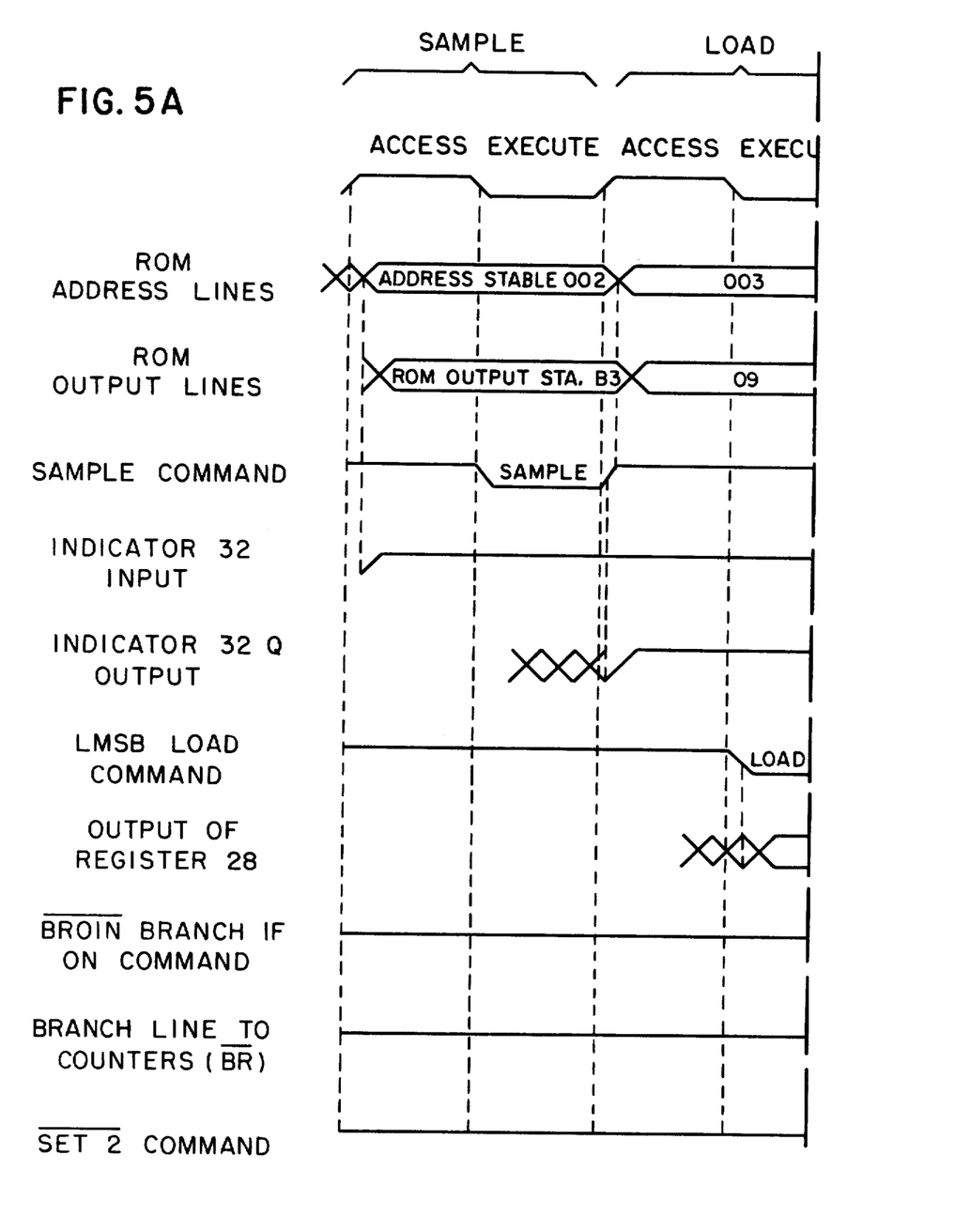
FIGS. 5A and 5B show a plurality of waveforms illustrating voltage-time relationships at selected points in the circuitry of the present invention.
Figure 5B:
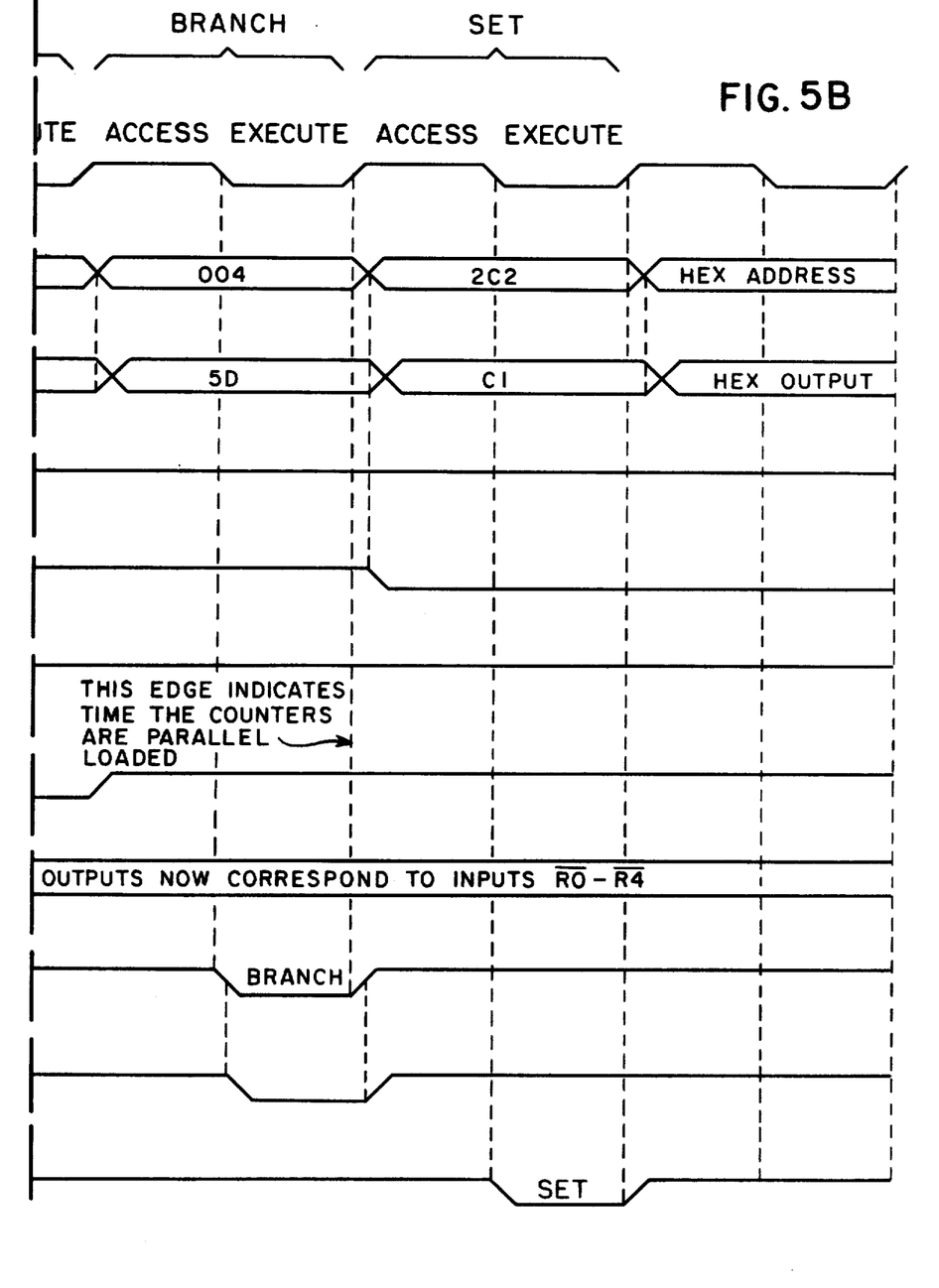

It will be seen in FIGS. 5A and 5B that the nominal square wave pattern of the train of clock pulses is actually a pattern in which the leading and trailing edges of the pulses are inclined from the vertical, indicating that a finite time interval is required for the clock voltages to shift between upper and lower logic levels. In the illustrated embodiments of the circuit of the present invention, the address applied to the ROM 12 will become stable at approximately the halfway point of the rising leading edge of the "access" portion of the clock pulse, and so that the change in logic level of the decoded operation code signal will take place at approximately the halfway point of the falling trailing edge of the "access" portion of the clock pulse.

The operation of the previously-described detailed circuitry of FIGS. 2A to 2D inclusive and 3 will now be described in terms of an illustrative operating sequence of the controller. It will be recognized that the controller is capable of many different operating sequences involving different types of commands, which will be readily apparent to one skilled in the art after perusal of the explanation appearing herein, taken in conjunction with the accompanying drawing.

Let it be assumed that in a program which the controller 10 is to perform, a branch of more than 32 positions must be made. Let it further be assumed that the next four addresses of the ROM 12 to be accessed are as shown in the table below, with the corresponding operation codes and function codes as shown. A description also appears in the table of the function to be performed by the operation code and function code for each of the addresses. A fifth address also appears in the table, representing the address to which the branch is made.

| | BINARY ADDRESS $A_9 \cdots A_0$ | OP CODE COMMAND $R_7 R_6 R_5$ | FUNCTION CODE $R_4 R_3 R_2 R_1 R_0$ | DESCRIPTION |
|---|---|---|---|---|
| (1) | 0000000001 | 1 1 1 | 1 1 1 1 1 | $\overline{\text{SET 1}}$ comand causes output to utilizing device selected by function code. |
| (2) | 0000000010 | 1 0 1 | 1 0 0 1 1 | $\overline{\text{SAMPLE}}$ command applied to indicator. Indicator is set. $R_4$ selects one of two multiplexers. $R_3$-$R_0$ selects one of 16 multiplexer input lines. |
| (3) | 0000000011 | 0 0 0 | 0 1 0 0 1 | LMSB command causes function code bits $R_4$-$R_0$ to be inverted and loaded into 5-bit register to constitute most significant address bits for subsequent branch operations. |
| (4) | 0000000100 | 0 1 0 | 1 1 1 0 1 | $\overline{\text{BRION}}$ command cause branch since indicator is on. Content of 5-bit register is applied to address register |

| BINARY ADDRESS $A_9$ - - - $A_0$ | OP CODE COMMAND $R_7R_6R_5$ | FUNCTION CODE $R_4R_3R_2R_1R_0$ | DESCRIPTION |
|---|---|---|---|
| | | | as 5 most significant bits of next address. Function code bits $R_4$-$R_0$ are inverted and applied to address register as 5 least significant bits of next address. |
| (5) 1011000010 | 1 1 0 | 0 0 0 0 1 | $\overline{\text{SET 2}}$ command at address branched to cause output to a utilizing device selected by function code. |

Since hexadecimal notation is often used in place of binary notation, it may be of interest to note that the hexadecimal equivalents of the binary addresses are respectively 001, 002, 003, 004 and 2C2; and that the hexadecimal equivalents of the operation code commands are respectively FF, B3, 09, 5D and C1.

The waveforms of FIGS. 5A and 5B show the various signals required to perform a branch operation of the controller, and correspond to the second, third, fourth and fifth addresses of the table given above. Also shown in FIGS. 5A and 5B in the proper time sequence on the appropriate waveforms are the hexadecimal numbers comprising the addresses and instructions of the various cycles of controller operation. The first $\overline{\text{SET}}$ command appearing in the table has been omitted from the waveforms of FIG. 5 in the interest of conserving space, because it is not a necessary part of the operating sequence which produces a branch command, and because it is similar to the $\overline{\text{SET}}$ command of the fifth address, which is shown in the waveforms.

The operating sequence set out in the above table commences with the address register 14 applying a binary address 0000000001, as shown at cycle (1), to the ROM 12. The corresponding instruction includes an operation code 111 which is inverted by the inverters 64, 66, 68 and applied to the decoder 22 to generate a $\overline{\text{SET 1}}$ command to a utilizing device (not shown), which may be of any appropriate type, such as a latch, a flip-flop, a solenoid, a motor, etc., selected by the function code portion $R_4$, $R_3$, $R_2$, $R$, $R_0$ of the corresponding instruction. The function bits of the instruction are inverted by the inverters 54, 56, 58, 60 and 62, and act through a suitable decoding means to select the particular utilizing device to which the $\overline{\text{SET 1}}$ command is applied. The decoding means employed for decoding the function bits does not constitute a part of the present invention, and is not shown. However, one suitable decoding means could include a pair of decoders similar to the decoder 22, with the signal bit $R_4$ being used to select one of the two decoders, and the signal bits $R_0$ and $R_3$ being used as inputs to the two decoders, thus making it possible to select one of 32 different lines.

The above operation has no specific relation to the branch operation which follows in the illustrative sequence. It does not appear in the waveforms of FIGS. 5A and 5B, as previously noted, and is included only to show a typical sequencer operation prior to the commencement of a branch operation.

Early in the "access" portion of the next clock signal, the address register 14 is incremented by one, so that the address presented to the ROM 12 by the address register 14 is 0000000010, as shown in cycle (2) of the above table. Presentation of this address to the ROM 12 results, as shown in cycle (2), in the output from the ROM of an instruction which includes an operation code 101 and a function code 10011. The bits are inverted by their respective inverters, and the inverted operation code bits are applied to the decoder 22 to generate a $\overline{\text{SAMPLE}}$ command, which is applied to the indicator 32. Simultaneously, the function code bits $R_3$ and $R_0$ have selected one of sixteen lines applied to the two multiplexers 24, 26 and the bit $R_4$ is used to select one of the two multiplexers, depending upon the logic level of said bit.

The signal level on the selected line of the selected multiplexer represents the condition of a selected device or component, such as a latch, flip-flop, etc., external of the controller, which device it is desired to sample in order to determine a future sequence of controller operation. Said signal level is applied to an input of the NAND gate 27 (FIG. 3), and thence to the input 34 of the indicator 32. The $\overline{\text{SAMPLE}}$ command is also applied to an input of the indicator 32, and in this instance it will be assumed that the indicator is set by these two signals to an "on" state. Accordingly, an output signal from the indicator 32 of active high logic level is applied to an input of the exclusive OR gate 38, and an output signal from the indicator 32 of active low logic level is applied to an input of the exclusive OR gate 40. These gates are thus conditioned for the reception of one or another type of branch signal during a subsequent operating cycle of the controller 10.

During a third cycle of controller operation, the address register 14 is once again incremented by one, so that the address presented to the ROM 12 by the address register 14 is 0000000011, as shown in the table. Presentation of this address to the ROM 12 results in an instruction which includes an operation code 000 and a function code 01001. The inverted operation code bits are applied to the decoder 22 to produce an LMSB command, which is applied over the conductor 84 to the 5-bit register 28 to cause loading therein of the five function code bits 01001 of the instruction after their inversion to 10110.

During a fourth cycle of controller operation, the address register is once again incremented by one, so that the address presented to the ROM 12 by the address register 14 is 0000000100, as shown in the table. Presentation of this address to the ROM 12 results in an instruction comprising operation code 010 and function code 11101. The inverted operation code bits are applied to the decoder 22 to produce a $\overline{\text{BRION}}$ command, which is applied over the terminal 42 to the gate 38 (FIG. 3). Since the indicator 32 was set during the second controller cycle, described above, a signal is propagated from the gate 38 through the gates 46 and 48 to provide a $\overline{\text{BRANCH}}$ signal at the terminal 50 (FIG. 3) which is associated with the terminal 92 (FIG. 2A). The $\overline{\text{BRANCH}}$ signal is applied over the conductors 90 (FIGS. 2A and 2B) to the counters 16, 18 and 20. This results in loading into the counters 16 and 18 of the five bits 10110 stored in the register 28, to constitute the five most significant bits of the address register 14, and further results in the loading into the counters 18 and 20 of the inverted five function code bits 11101 of the instruction after their inversion to 00010.

During a fifth cycle of controller operation, initiated by the next clock pulse, the address register 14 is not incremented. Instead, the address 1011000010, entered into said register during the previous cycle as described above, is presented to the ROM 12, as shown in the table. This results in an instruction comprising an operation code 110 and a function code 00001. The inverted operation code bits are applied to the decoder 22 to produce a $\overline{\text{SET 2}}$ command which is applied to a utilizing device of any appropriate type, such as a latch, a flip-flop, a solenoid or a motor, to produce desired action in a peripheral apparatus under control of the controller. The particular utilizing device to which the command is applied is selected by the inverted function code bits 00001 of the instruction by any suitable decoding means, as previously described in connection with description of the first cycle appearing in the above table.

It may be noted that the branching operation of the fourth cycle above was a conditional branch command $\overline{\text{BRION}}$ (Branch If Indicator On), so that if the indicator 32 had not been in a "set" state, the branch would not have taken place, and the address register would simply have incremented by one during the cycle. Alternatively, if a different conditional branch command $\overline{\text{BRIOF}}$ (Branch If Indicator Off) had been employed, and the indicator 32 had not been in a "set" state, the branch would have taken place. Similarly, if an unconditional branch command $\overline{\text{BRANCH}}$ had been employed, the branch would have taken place regardless of the condition of the indicator 32.

It may also be noted that if a branch of 32 positions or less had been desired, the branching operation could have taken place without the loading of the inverted function bits into the register 28 under control of the operation code command LMSB in the third cycle above. In such a case, the contents of the register 28 would not be altered from either the last information previously loaded into the register 28, or 00000, if there had been no LMSB command since the last master reset signal $\overline{\text{MR}}$ on the terminal 86, which is effective to zeroize all of the counters 16, 18, 20, 28, as well as to reset the indicator 32. Application of a branch signal $\overline{\text{BR}}$ to the counters 16, 18, 20 from the terminal 92 would then cause the unaltered contents of the register 28 to be loaded into said counters, together with the function code bits $R_0$ to $R_4$ which were output from the ROM 12 as a portion of the instruction which also contained the branch command.

It may be noted in connection with the command code structure shown for illustrative purposes that a second load command $\overline{\text{LOAD 2}}$ is also available for use, although the particular structure for utilization of this command is not shown in the drawings. It is contemplated that this command could be used as an alternative to the LSMB command where it is desired to introduce a delay in loading of the register 28 rather than loading the register at the time of the cycle in which the command is generated. The $\overline{\text{LOAD 2}}$ command could be applied to a delay device, of any suitable type, the output of which could then be applied to the register 28. Other alterations and variations of this type could also be utilized in the controller circuitry, if advantageous for particular applications.

It will be apparent that the sequence of controller cycles tabulated in the table above and shown in the waveforms of FIG. 5 are illustrative only, and that a wide variety of operation code commands and operating sequences for the controller of the present invention may be employed within the scope of the present invention.

While the form of the invention illustrated and described herein is particularly adapted to fulfill the objects aforesaid, it is to be understood that other and further modifications within the scope of the following claims may be made without departing from the spirit of the invention.

What is claimed is:

1. A multi-cycle control system for causing a series of events to occur in sequence and capable of altering said sequence, comprising:

storage means for storing a plurality of coded instruction words at a corresponding plurality of addresses, each word comprising a first and a second portion;

address register means coupled to the storage means for providing an address to select a coded instruction word, said address register means being capable of incrementing the address provided in successive operations of the system by a predetermined increment and also capable of modifying the address in a non-incrementing mode;

decoding means coupled to the storage means and capable of generating operating code signals including conditional and unconditional branch signals from predetermined signal combinations of said first portion of each coded instruction word;

second register means coupled to the address register means and to the storage means for receiving said second portion of each coded instruction word from said storage means under control of an operating code signal from the decoding means to provide part of a new address and presenting an address modifying code which corresponds to said second portion to the address register means to cause a modified address to be provided to the storage means by the address register means during a subsequent operation of the system; and branch control means coupled to and controlled by the decoding means and coupled to the address register means for controlling whether or not an address modifying code is loaded into the address register means during a given operation, said branch control means including indicator means settable during a first cycle by a signal from a selected origin, and also including logic means responsive to the condition of the indicator means and to conditional and unconditional branch signals, and capable of controlling said second register means to determine whether or not a modified address is provided to the storage means by the address register means during a subsequent cycle of operation of the system.

2. A control system for causing a series of events to occur in sequence and capable of altering said sequence, comprising:

storage means for storing a plurality of coded instruction words at a corresponding plurality of addresses, each word comprising a first and a second portion;

address register means coupled to the storage means for providing an address to select a coded instruction word, said address register means being capable of incrementing the address provided in successive operations of the system by a predetermined increment and also capable of modifying the address in a non-incrementing mode;

decoding means coupled to the storage means and capable of generating operating code signals including an unconditional branch signal and first and second conditional branch signals from predetermined signal combinations of said first portion of each coded instruction word;

second register means coupled to the address register means and to the storage means for receiving said second portion of each coded instruction word from said storage means under control of an operating code signal from the decoding means to provide part of a new address and presenting an address modifying code which corresponds to said second portion to the address register means to cause a modified address to be provided to the storage means by the address register means during a subsequent operation of the system; and branch control means controlled by the decoding means and coupled to the address register means for controlling whether or not an address modifying code is loaded into the address register means during a given operation, said branch control means including an indicator flip-flop settable by a signal originating externally of the control system, a pair of exclusive OR gates each having one input connected to an output of the indicator flip-flop and a second input connected to a conditional branch signal output of the decoding means, a first NAND gate having its inputs connected to the outputs of the exclusive OR gates, and a second NAND gate having a first input connected to the output of the first NAND gate and a second input connected to an unconditional branch signal output of the decoding means, the output of the second NAND gate comprising the output of the branch control means.

3. A multi-cycle control system for causing a series of events to occur in sequence and capable of altering said sequence, comprising:

storage means for storing a plurality of coded instruction words at a corresponding plurality of addresses, each word comprising a first and a second portion;

address register means coupled to the storage means for providing an address to select a coded instruction word, said address register means being capable of incrementing the address provided in successive operations of the system by a predetermined increment and also capable of modifying the address in a non-incrementing mode;

decoding means coupled to the storage means and capable of generating first, second and third operating code signals from predetermined signal combinations of said first portion of each coded instruction word;

second register means coupled to the address register means and to the storage means for receiving said second portion of each coded instruction word from said storage means under control of an operating code signal from the decoding means to provide part of a new address and presenting an address modifying code which corresponds to said second portion to the address register means to cause a modified address to be provided to the storage means by the address register means during a subsequent operation of the system;

coupling means coupling said storage means to said address register means for loading said second portion of a coded instruction word into a second section of the address register means; and branch control means including indicator means settable during a first cycle of said system under the control of an external signal and a first operating code signal, a second portion of a first coded instruction word being capable of being loaded into said second register means during a second cycle by a second operating code signal to provide an address modifying code, and the address modifying code from the second register means plus a second portion of a subsequent coded instruction word from the storage means being capable of being simultaneously loaded through the coupling means into the address register means during a third cycle by a signal from the branch control means which in turn is controlled by the condition of the indicator means and by a third operating code signal.

4. A multi-cycle control system for causing a series of events to occur in sequence and capable of altering said sequence, comprising:

read-only memory storage means for storing a plurality of coded instruction words at a corresponding plurality of addresses, each word comprising a first and a second portion;

address register means including a plurality of counters coupled to the storage means for providing an address to select a coded instruction word, said address register means being capable of incrementing the address provided in successive operations of the system by a predetermined increment and also capable of modifying the address in a non-incrementing mode;

decoding means coupled to the storage means and capable of generating first, second and third operating code signals, from predetermined signal combinations of said first portion of each coded instruction word;

second register means including a multi-bit latch coupled to the address register means and to the storage means for receiving said second portion of each coded instruction word from said storage means under control of an operating code signal from the decoding means to provide part of a new address and presenting an address modifying code which corresponds to said second portion to the address register means to cause a modified address to be provided to the storage means by the address register means during a subsequent operation of the system;

coupling means coupling said read-only memory storage means to said address register means for loading said second portion of a coded instruction word into a second section of the address register means; and branch control means including indicator means settable during a first cycle of said system under the control of an external signal and a first operating code signal, said branch control means also including logic means, a second portion of a first coded instruction word being capable of being loaded into said second register means during a second cycle by application of a second operating code signal to said logic means, to provide an address modifying code, and the address modifying code from the second register means plus a second portion of a subsequent coded instruction word from the read-only memory storage means being capable of being simultaneously loaded through the coupling means into the address register means during a third cycle by a signal from the branch control means which in turn is controlled by the condition of the indicator means and by application of a third operating code signal to said logic means.

5. A multi-cycle control system for causing a series of events to occur in sequence and capable of altering said sequence, comprising:

read-only memory storage means for storing a plurality of coded instruction words at a corresponding plurality of addresses, each word comprising a first and a second portion;

address register means including a plurality of counters coupled to the storage means for providing an address to select a coded instruction word, said address register means being capable of incrementing the address provided in successive operations of the system by a predetermined increment and also capable of modifying the address in a non-incrementing mode;

decoding means coupled to the storage means and capable of generating first and second operating code signals, from predetermined signal combinations of said first portion of each coded instruction word;

coupling means coupling said read-only memory storage means to said address register means for loading said second portion of a coded instruction word into a section of the address register means; and branch control means including indicator means settable during a first cycle of said system under the control of an external signal and a first operating code signal, said branch control means also including logic means, a second portion of a coded instruction word from the read-only memory storage means being capable of being loaded through the coupling means into the address register means during a subsequent cycle by a signal from the branch control means which in turn is controlled by the condition of the indicator means and by application of a second operating code signal to said logic means.

6. A control system for causing a series of events to occur in sequence and capable of altering said sequence, comprising:

single phase clock means for generating a clock signal including an access portion and an execute portion to drive said control system;

storage means for storing a plurality of coded instruction words at a corresponding plurality of addresses, each word comprising a first and a second portion;

address register means coupled to the storage means for providing an address to select a coded instruction word, said address register means being capable of incrementing the address provided in successive operations of the system by a predetermined increment during the access portion of each clock signal and also capable of modifying the address in a non-incrementing mode;

decoding means coupled to the storage means and capable of generating operating code signals from predetermined signal combinations of said first portion of each coded instruction word during the execute portion of each clock signal;

second register means coupled to the address register means and to the storage means for receiving said second portion of each coded instruction word from said storage means under control of an operating code signal from the decoding means during the execute portion of a clock signal to provide part of a new address and presenting an address modifying code which corresponds to said second portion to the address register means to cause a modified address to be provided to the storage means by the address register means during a subsequent operation of the system; and branch control means controlled by the decoding means and coupled to the address register means for controlling whether or not an address modifying code is loaded into the address register means during a given operation.

* * * * *